United States Patent
Ando et al.

(10) Patent No.: US 9,653,534 B2
(45) Date of Patent: May 16, 2017

(54) TRENCH METAL-INSULATOR-METAL CAPACITOR WITH OXYGEN GETTERING LAYER

(71) Applicant: International Business Machines Corporation, Armonk, NY (US)

(72) Inventors: Takashi Ando, Tuckahoe, NY (US); Eduard A. Cartier, New York, NY (US); Michael P. Chudzik, Sunnyvale, CA (US); Aritra Dasgupta, Wappingers Falls, NY (US); Herbert L. Ho, New Windsor, NY (US); Donghun Kang, Hopewell Junction, NY (US); Rishikesh Krishnan, Painted Post, NY (US); Vijay Narayanan, New York, NY (US); Kern Rim, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 131 days.

(21) Appl. No.: 14/572,974

(22) Filed: Dec. 17, 2014

(65) Prior Publication Data

US 2016/0181353 A1    Jun. 23, 2016

(51) Int. Cl.
*H01L 29/66*    (2006.01)
*H01L 49/02*    (2006.01)
*H01L 27/108*   (2006.01)
*H01L 23/26*    (2006.01)

(52) U.S. Cl.
CPC ............. *H01L 28/90* (2013.01); *H01L 23/26* (2013.01); *H01L 27/1087* (2013.01); *H01L 27/10861* (2013.01); *H01L 28/60* (2013.01); *H01L 29/66181* (2013.01); *H01L 2924/0002* (2013.01)

(58) Field of Classification Search
CPC ....... H01L 21/64; H01L 21/70; H01L 21/702; H01L 21/71; H01L 29/66007
See application file for complete search history.

(56) References Cited

U.S. PATENT DOCUMENTS

| | | | |
|---|---|---|---|
| 6,982,230 B2 | 1/2006 | Cabral, Jr. et al. | |
| 7,030,481 B2 | 4/2006 | Chudzik et al. | |
| 7,091,542 B1 | 8/2006 | Yang et al. | |
| 7,671,394 B2 | 3/2010 | Booth, Jr. et al. | |
| 7,750,388 B2 | 7/2010 | Ho et al. | |
| 8,304,836 B2 | 11/2012 | Jagannathan et al. | |
| 8,363,379 B2 | 1/2013 | Edelstein et al. | |

(Continued)

OTHER PUBLICATIONS

Choi et al., "Extremely Scaled Gate-First High-k/Metal Gate Stack with EOT of 0.55 nm Using Novel Interfacial Layer Scavenging Techniques for 22nm Technology Node and Beyond", 2009 Symposium on VLSI Technology Digest of Technical Papers, pp. 138-139.

(Continued)

*Primary Examiner* — Cheung Lee
(74) *Attorney, Agent, or Firm* — Scully, Scott, Murphy & Presser, P.C.; Steven J. Meyers

(57) ABSTRACT

A method including forming an oxygen gettering layer on one side of an insulating layer of a deep trench capacitor between the insulating layer and a substrate, the oxygen gettering layer including an aluminum containing compound, and depositing an inner electrode on top of the insulating layer, the inner electrode including a metal.

8 Claims, 22 Drawing Sheets

(56) References Cited

U.S. PATENT DOCUMENTS

| | | |
|---|---|---|
| 8,853,792 B2 | 10/2014 | Chowdhury et al. |
| 2003/0045068 A1* | 3/2003 | Gutsche ............ H01L 27/10861 |
| | | 438/386 |
| 2003/0222296 A1 | 12/2003 | Kumar et al. |
| 2009/0108294 A1 | 4/2009 | Choi et al. |

OTHER PUBLICATIONS

Frank, "High-k / Metal Gate Innovations Enabling Continued CMOS Scaling", IBM T.J. Watson Research Center, 2011 IEEE, pp. 50-58.

Niinisto et al., "Controlled growth of HfO2 thin films by atomic layer deposition from cyclopentadienyl-type precursor and water", PAPER, www.rsc.org/materials, Journal of Materials Chemistry, 2005, vol. 15, pp. 2271-2275.

Pampillon et al., "Towards metal electrode interface scavenging of rare-earth scandates: A Sc2O3 and Gd2O3 study", Microelectronic Engineering vol. 88, 2011, pp. 1357-1360.

\* cited by examiner

TRENCH METAL-INSULATOR-METAL CAPACITOR WITH OXYGEN GETTERING LAYER

BACKGROUND

The present invention relates generally to semiconductor manufacturing, and, more particularly, to a trench metal-insulator-metal (MIM) capacitor having an oxygen gettering layer.

Embedded memory devices, such as embedded dynamic random access memory (eDRAM), having deep trench capacitors have demonstrated great advantages over planar-stacked device structures. Trench capacitors have replaced the planar storage capacitors in order to meet the scaling demands for high performance dynamic random access memory (DRAM) cell production.

A trench capacitor is a three-dimensional device formed by etching a trench into a semiconductor substrate. After trench etching, a doped region is typically formed in the lower portion of the trench surrounding interior walls of the trench, which serves as a bottom electrode, an outer electrode, or a buried plate electrode of the trench capacitor. An insulating layer or node dielectric is then formed over the bottom electrode in the trench, which serves as the insulating layer of the trench capacitor, followed by filling the trench, for example, with doped polycrystalline silicon (hereinafter "poly-Si"), which serves as the top electrode, inner electrode, or upper electrode of the trench capacitor.

However, the doped poly-Si inner or upper electrode of the conventional trench capacitor as described hereinabove has a relatively high electrical resistivity as compared to metallic electrodes. Further, the conventional trench capacitor in an eDRAM or DRAM device is connected to an adjacent field effect transistor (FET) by an out-diffused buried strap, which is also highly resistive. The highly resistive poly-Si electrode and out-diffused buried strap lead to high parasitic resistance in the eDRAM or DRAM device, which in turn limits the performance of the device. As eDRAM and DRAM technologies are scaled beyond the 65 nm node, the deleterious impact of the highly resistive poly-Si electrode and out-diffused buried strap on the performance of the eDRAM or DRAM cells, especially on the read/write speed of such memory cells, becomes much more significant, because the resistivity of the poly-Si electrode and the out-diffused buried strap does not scale with the remaining components of the eDRAM or DRAM cell.

SUMMARY

According to an embodiment of the present invention, a method is provided. The method may include forming an oxygen gettering layer on one side of an insulating layer of a deep trench capacitor between the insulating layer and a substrate, the oxygen gettering layer including an aluminum containing compound, and depositing an inner electrode on top of the insulating layer, the inner electrode including a metal.

According to another embodiment of the present invention, a method is provided. The method may include etching a deep trench into a substrate, the deep trench having a sidewall and a bottom, forming an oxygen gettering layer in direct contact with the substrate, the oxygen gettering layer including titanium aluminum nitride, titanium aluminum carbide, tantalum aluminum nitride, tantalum aluminum carbide, tungsten aluminum nitride, tungsten aluminum carbide, cobalt aluminum nitride, or cobalt aluminum carbide, forming an outer electrode above and in direct contact with the oxygen gettering layer, forming a high-k insulating layer above and in direct contact with the outer electrode, and forming an inner electrode above and in direct contact with the high-k insulating layer.

According to another embodiment of the present invention, a structure is provided. The structure may include a first oxygen gettering layer on one side of an insulating layer of a deep trench capacitor between the insulating layer and a substrate, the oxygen gettering layer including an aluminum containing compound, and an inner electrode on top of the insulating layer, the inner electrode including a metal.

BRIEF DESCRIPTION OF THE SEVERAL VIEWS OF THE DRAWINGS

The following detailed description, given by way of example and not intend to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
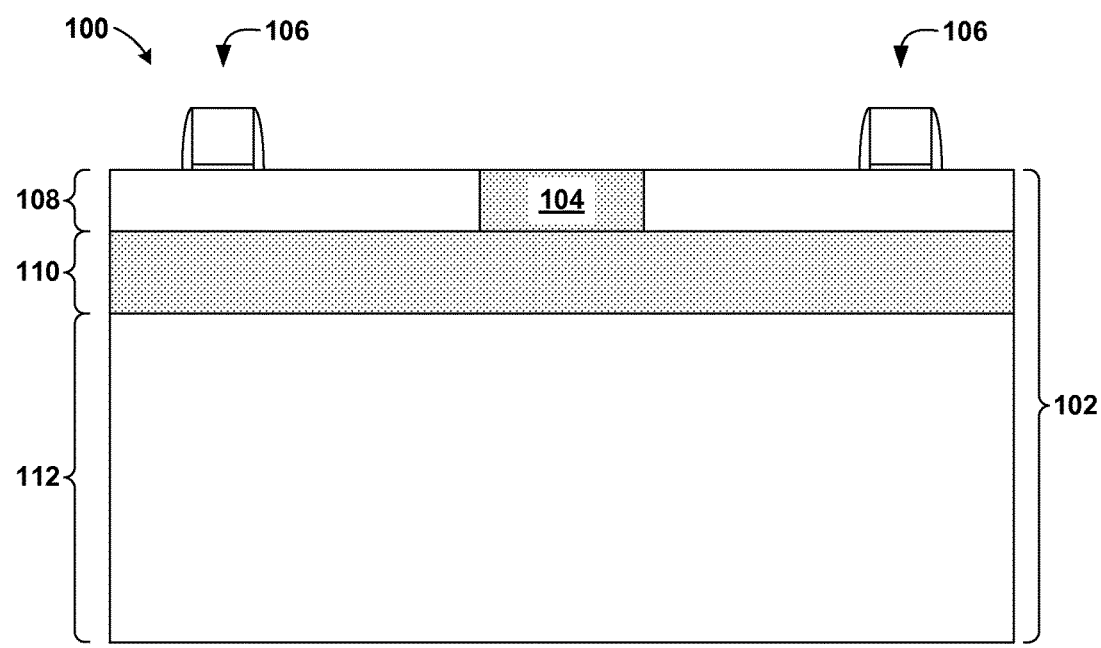
FIG. 1 illustrates a semiconductor-on-insulator substrate in accordance with an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Performance and reliability of a traditional trench metal-insulator-metal capacitor (hereinafter "MIM capacitor") rely on a clean and stable interface between the bottom electrode and the underlying substrate. Common formation of an interfacial oxide at or near the interface between the bottom electrode and the underlying substrate may degrade or destroy its stability. Therefore, the performance and reliability of the MIM capacitor may suffer due to the common formation of the interfacial oxide. As such, the interfacial oxide is unwanted and removal of such will improve the performance and reliability of the traditional MIM capacitor.

The present invention provides a solution to the performance and reliabilities issues associated with the formation of the interfacial oxide during fabrication of the MIM capacitor, as described hereinabove. Specifically, embodiments of the present invention provide improved MIM capacitors with an additional layer integrated specifically to curtail or eliminate the formation of the interfacial oxide by gettering, attracting, or trapping oxygen during fabrication.

The MIM capacitors of the embodiments of the present invention may be incorporated into eDRAM or DRAM devices that also contain transistors. The MIM capacitors are preferably connected to adjacent transistors in the eDRAM or DRAM devices by metallic (more preferably metal silicide) straps of relatively low resistivity. The MIM capacitors of the embodiments of the present invention may also be used in other applications, such as decoupling capacitors and so on.

While introducing metal into deep trench capacitors may be seen as a logical progression in the advance of such devices, it is important to note that there are many obstacles that have halted any actual progress in this direction. Most deep trench capacitors are processed before the active FET devices are formed in the semiconductor substrate. Introducing metal to the semiconductor substrate or exposing the substrate to a metal-processing tool before formation of the FET devices greatly magnifies the risk of metal contamination and the deleterious impact thereof on the device performance, because the high temperature processing steps required for transistor fabrication allow any metal atoms present in the semiconductor substrate to migrate into the active region of the chip and destroy the transistor performance.

Embodiments of the present invention therefore provide a method for integrating the processing steps required for fabricating the MIM capacitors into the conventional eDRAM or DRAM device fabrication processes. The method of the present invention minimizes the risk of metal contamination or migration during the transistor fabrication process, and results in little or no damage to the active region of the transistors formed adjacent to the trench capacitors in the eDRAM or DRAM devices.

Specifically, the present invention first forms the transistor components, such as the source/drain regions and the poly-Si gate electrodes, without introducing any metal species and thus minimizing the risk of metal contamination or migration during the transistor fabrication process. Then, the MIM capacitors are formed in the substrate with the transistor components being protected by a barrier layer, followed by a salicidation step that forms the metal silicide contact layers for the transistors and the metal silicide straps for connecting the trench capacitors and the transistors. Therefore, the metallic species are introduced on the wafer just before or in concomitance with other metal-related processes in the basic process sequence.

Such a method, as well as the resulting structure, will now be described in greater detail by referring to the accompanying FIGS. 1-17. Note that in these drawings, which are not drawn to scale, like and/or corresponding elements are referred to by like reference numerals. It is further noted that in the drawings, only two FETs and two trench capacitors are shown on/in a semiconductor substrate. Although illustration is made to such an embodiment, the present invention is not limited to the formation of any specific number of trench capacitors and/or FETs in/on the semiconductor substrate.

Referring now to FIGS. 1-17, exemplary process steps of forming a MIM capacitor having an oxygen gettering layer in accordance with an embodiment of the present invention are shown, and will now be described in greater detail below. It should be noted that FIGS. 1-17 all represent a cross section view of a semiconductor structure 100 ("structure").

Reference now to FIG. 1, which shows a semiconductor substrate 102, after the completion of all processes pertaining to the fabrication of a shallow trench isolation region 104 and transistors 106. The semiconductor substrate 102 may include any semiconductor material including, but not limited to: Si, SiC, SiGe, SiGeC, Ge alloys, GaAs, InAs, InP, as well as other III-V or II-VI compound semiconductors. The semiconductor substrate 102 may also be comprised of a layered semiconductor structure such as Si/SiGe, a silicon-on-insulator structure or a SiGe-on-insulator structure. In some embodiments of the present invention, it is preferred that the semiconductor substrate 102 be composed of a Si-containing semiconductor material, for example a semiconductor material that includes silicon. The semiconductor substrate 102 may be doped, undoped or contain doped and undoped regions therein (not shown). The doped device regions are typically known or referred to as "wells".

In the specific embodiment shown in FIG. 1, the transistors 106 are fabricated on an upper surface of a semiconductor-on-insulator (SOI) substrate 102 that contains a semiconductor layer 108, a buried insulator layer 110, and a semiconductor base layer 112 (hereinafter "base layer") that is located underneath the buried insulator layer 110. The semiconductor layer 108 may include any of the several semiconductor materials included in the base layer 112. In general, the base layer 112 and the semiconductor layer 108 may include either identical or different semiconducting materials with respect to chemical composition, dopant concentration, and crystallographic orientation. In one embodiment of the present invention, the base layer 112 and the semiconductor layer 108 may include semiconducting materials that include at least different crystallographic orientations. Typically the base layer 112 or the semiconductor layer 108 include a {110} crystallographic orientation and the other of the base layer 112 or the semiconductor layer 108 includes a {100} crystallographic orientation. Typically, the semiconductor layer 108 includes a thickness ranging from about 5 nm to about 100 nm. Methods for making the semiconductor layer 108 are well known in the art. Non-limiting examples include SIMOX (Separation by Implantation of Oxygen), wafer bonding, and ELTRAN® (Epitaxial Layer TRANsfer).

The buried insulator layer 110 may be formed from any of several dielectric materials known in the art. Non-limiting examples include, for example, oxides, nitrides, and oxynitrides of silicon. Oxides, nitrides and oxynitrides of other elements are also envisioned. In addition, the buried insulator layer 110 may include crystalline or non-crystalline dielectric material. Moreover, the buried insulator layer 110 may be formed using any of several known methods. Non-limiting examples include ion implantation methods, thermal or plasma oxidation or nitridation methods, chemical vapor deposition methods and physical vapor deposition methods. In one embodiment, the buried insulator layer 110 may be about 150 nm thick. Alternatively, the buried insulator layer 110 may include a thickness ranging from about 10 nm to about 500 nm.

The base layer 112 may be made from any of several known semiconductor materials such as, for example, a bulk silicon substrate. Other non-limiting examples include silicon, germanium, silicon-germanium alloy, silicon carbide, silicon-germanium carbide alloy, and compound semiconductor materials. Non-limiting examples of compound semiconductor materials include gallium arsenide, indium arsenide, and indium phosphide. Typically, the base layer 112 may be about, but is not limited to, several hundred microns thick. For example, the base layer 112 may include a thickness ranging from 0.5 mm to about 1.5 mm. While this embodiment of the invention is illustrated using a SOI substrate, it is understood that the present invention can be easily extended to a bulk semiconductor substrate, and the possible difference in process steps for the SOI substrate and the bulk semiconductor substrate, if any, will be mentioned at the appropriate steps to be described hereinafter.

The shallow trench isolation region 104 are formed into the semiconductor substrate 102, to provide isolation between doped device regions. The shallow trench isolation region 104 can be readily formed utilizing a conventional trench isolation process well known to those skilled in the art. For example, lithography, etching and filling of the trench with a trench dielectric may be used in forming the trench isolation region 104. Optionally, a liner may be formed in the trench prior to trench fill, a densification step may be performed after the trench fill and a planarization process may follow the trench fill as well. The field oxide may be formed utilizing a so-called local oxidation of silicon process. The shallow trench isolation region 104 can extend to the buried insulator layer 110, as is shown in FIG. 1, or it may not extend down to the surface of the buried insulator layer 110.

The transistors 106 are formed by conventional front-end-of-line (FEOL) processing steps. For example, deposition, lithography, etching, and implantation can be used, or a replacement gate process can be used. The transistors 106 are preferably field effect transistors (FETs) having source/drain regions, gate electrodes, and optionally source/drain extension regions and source/drain halo regions (not shown). No metal silicide contact layers have been formed in the source and drain regions or the gate electrodes at this point of the inventive method.

Figure 2:
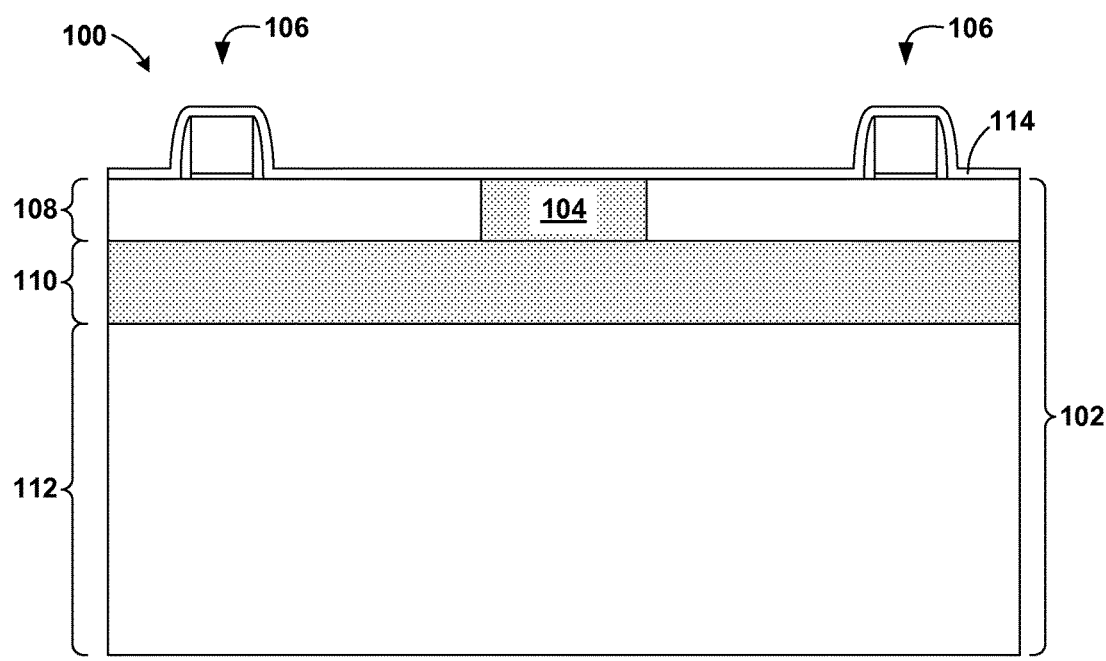
FIG. 2 illustrates forming a barrier layer on the semiconductor-on-insulator substrate in accordance with an exemplary embodiment.

Referring now to FIG. 2, a barrier layer 114 may be deposited over the entire structure 100. The barrier layer 114 is preferably, but not necessarily, a silicon nitride film having a thickness ranging from about 3000 Å to about 1 µm. The barrier layer 114 functions to: (1) act as a barrier between the semiconductor material and the silicide-forming metal to be deposited in subsequent steps and prevent migration of the metal species into the active regions of the transistors, and (2) act as a hard-mask for forming a deep trench in the semiconductor substrate 102 for the MIM capacitors.

Figure 3:
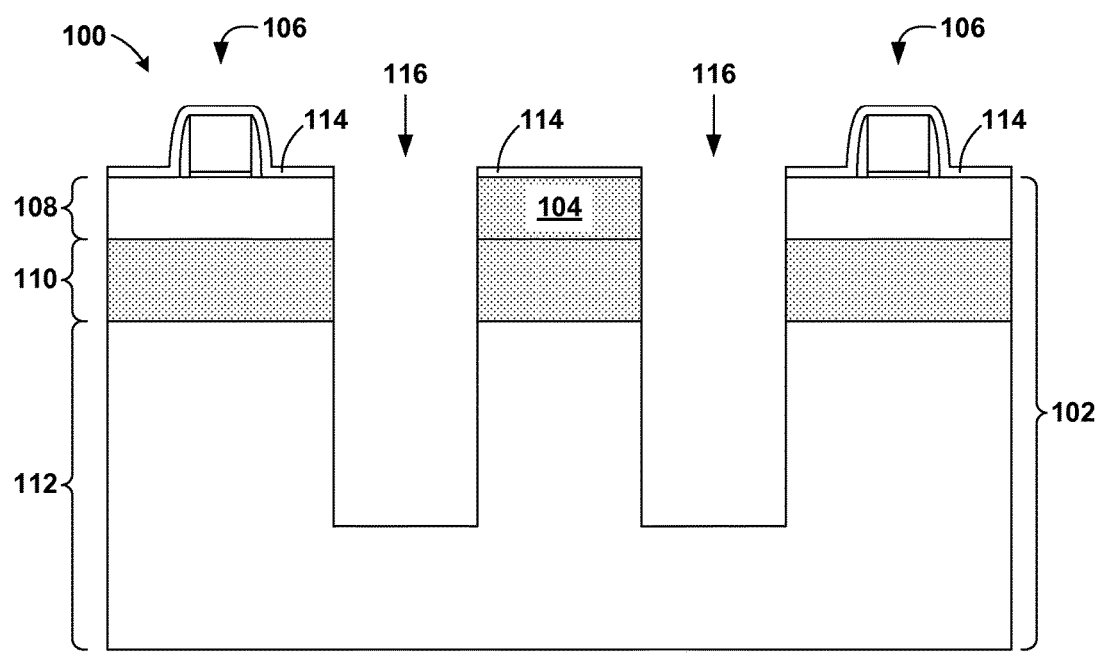
FIG. 3 illustrates etching a deep trench in accordance with an exemplary embodiment.

Referring now to FIG. 3, after deposition of the barrier layer 114, a deep trench 116 is etched in the semiconductor substrate 102, using the barrier layer 114 as a hard mask. There are no further masking steps pertaining to the MIM capacitors in the process of the present invention, so this is a single masking step that is additional to the conventional trench capacitor fabrication process. Specifically, during the trench-etching step, a photoresist (not shown) may be applied to the semiconductor substrate 102 over the barrier layer 114. The photoresist can be applied by any technique, including, but not limited to: coating or spin-on techniques. A mask (not shown) that is patterned with trench shapes is formed over the photoresist, and the mask pattern is transferred to the photoresist using a photolithographic process, which creates recesses in the uncovered regions of the photoresist. The patterned photoresist is subsequently used to create the same pattern of recesses in the barrier layer 114, using a reactive ion etching (RIE) technique. The photoresist may or may not be stripped from the semiconductor substrate 102 after the barrier layer 114 is patterned. The entire structure 100 is then exposed to a plasma based RIE technique or any other dry etching technique for forming the deep trench 116 in the semiconductor substrate 102, as shown in FIG. 3. The preferred depth of the deep trench 116 may range from about 1 μm to about 7 μm, and ranges there between.

Figure 4:
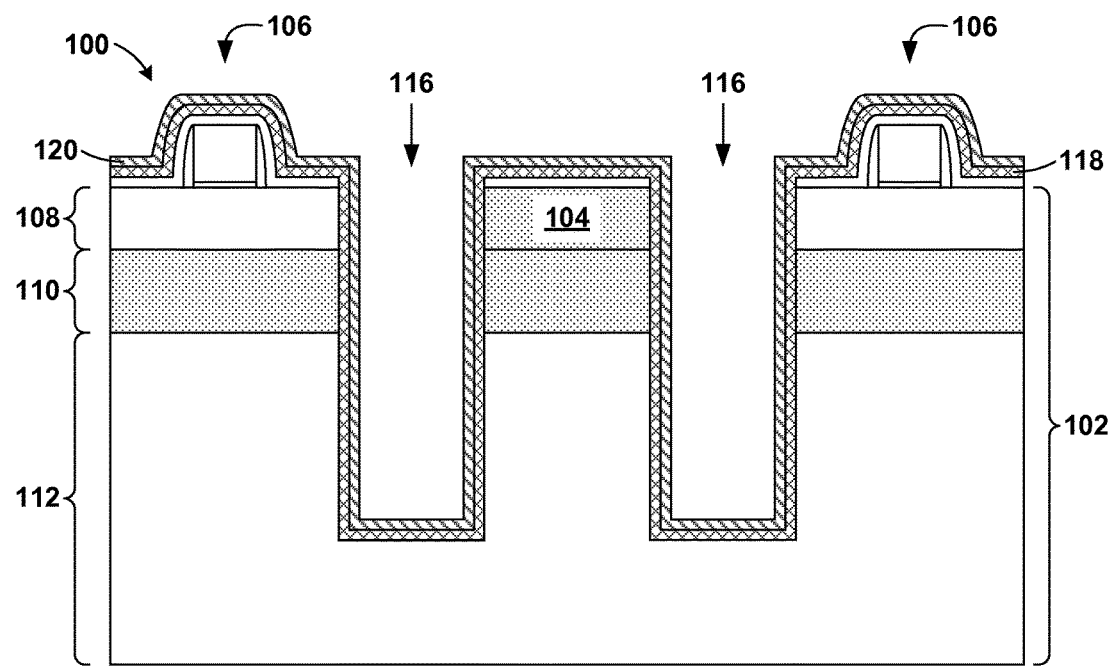
FIG. 4 illustrates forming an oxygen gettering layer and a thin metallic film in accordance with an exemplary embodiment.

Referring now to FIG. 4, after formation of the deep trench 116, an oxygen gettering layer 118 may be conformally deposited over the entire structure 100 of FIG. 3 as well as within the deep trench 116. In an embodiment, the oxygen gettering layer 118 may include an element or compound of elements which will scavenge or getter oxygen during capacitor processing and substantially reduce or eliminate the formation of unwanted interfacial oxides. In an embodiment, the gettering layer 118 may include a pentavalent ion which may attract the oxygen in order to reduce or eliminate the formation of unwanted interfacial oxides. In a particular embodiment, the oxygen gettering layer 118 includes an aluminum containing compound, the aluminum being the element specifically chosen to getter vagrant oxygen during processing and fabrication. In an embodiment, aluminum containing compounds to be used as the oxygen gettering layer 118 may include titanium aluminum nitride, titanium aluminum carbide, tantalum aluminum nitride, tantalum aluminum carbide, tungsten aluminum nitride, tungsten aluminum carbide, cobalt aluminum nitride, or cobalt aluminum carbide. The preferred thickness of the oxygen gettering layer 118 ranges from about 10 Å to about 50 Å. The oxygen gettering layer 118 may be formed by known deposition techniques, such as, for example, chemical vapor deposition (CVD), plasma enhanced chemical vapor deposition (PECVD), physical vapor deposition (PVD), or atomic layer deposition (ALD), plating, thermal or ebeam evaporation and sputtering.

In the present example, the oxygen gettering layer 118 is deposited directly on top of the substrate enabling it to effectively control oxidation of the substrate by gettering oxygen during capacitor processing. As such, the oxygen gettering layer 118 of the present embodiment may preferably be in direct contact with the semiconductor substrate 102, or more specifically, direct contact with the base layer 112 of the semiconductor substrate 102.

Next, a thin metallic film 120 is deposited over the entire structure of FIG. 3 as well as within the deep trench 116 directly on top of the oxygen gettering layer 118. The thin metallic film 120 will form the buried or outer electrodes of the trench capacitors of the present embodiment. The thin metallic film 120 may include any suitable metallic material(s) known in the art, including, but not limited to: metal(s), metal alloy(s), metal nitride(s), and/or metal silicide(s). Preferably, the thin metallic film 120 includes at least one material selected from the group consisting of Ti, TiN, W, WN, and Ru. The preferred thickness of the thin metallic film 120 ranges from about 300 Å to about 1000 Å. Such a thin metallic film 120 can be readily deposited by any suitable deposition technique, including, but not limited to: atomic layer deposition (ALD), chemical vapor deposition (CVD), and physical vapor deposition (PVD). The deposition process preferably provides sufficient sidewall coverage in the deep trench 116, so that the thin metallic film 120 is continuous.

In the event that the semiconductor substrate 102 contains a bulk semiconductor substrate, instead of the SOI structure as shown in the figures, additional implants, preferably angled implants, may be needed to introduce a p-type dopant into the sidewalls of the trench 116, in order to prevent potential shorting between the trench straps and the buried or outer electrodes, which are to be formed subsequently, and to allow biasing of the outer or buried electrodes. Preferably, the p-type dopants, such as B or BF2, would be implanted in the unfilled trench at 5-10° off the normal axis and using accelerating energies of 10 KeV or higher for B and 40 KeV or higher for BF2. Doses of 1E13-1E15 should provide sufficient p concentrations to prevent strap-plate shorting. Alternatively, a boron p-well can be implanted into the bulk semiconductor substrate to mitigate the potential strap-electrode shorting using accelerating energies of 125 KeV or higher and doses of 1E13 or higher. This process step can be done in the well module, and the p-doped region—introduced either through sidewall implants or through a high-energy well process—is electrically tied to ground.

Figure 5:
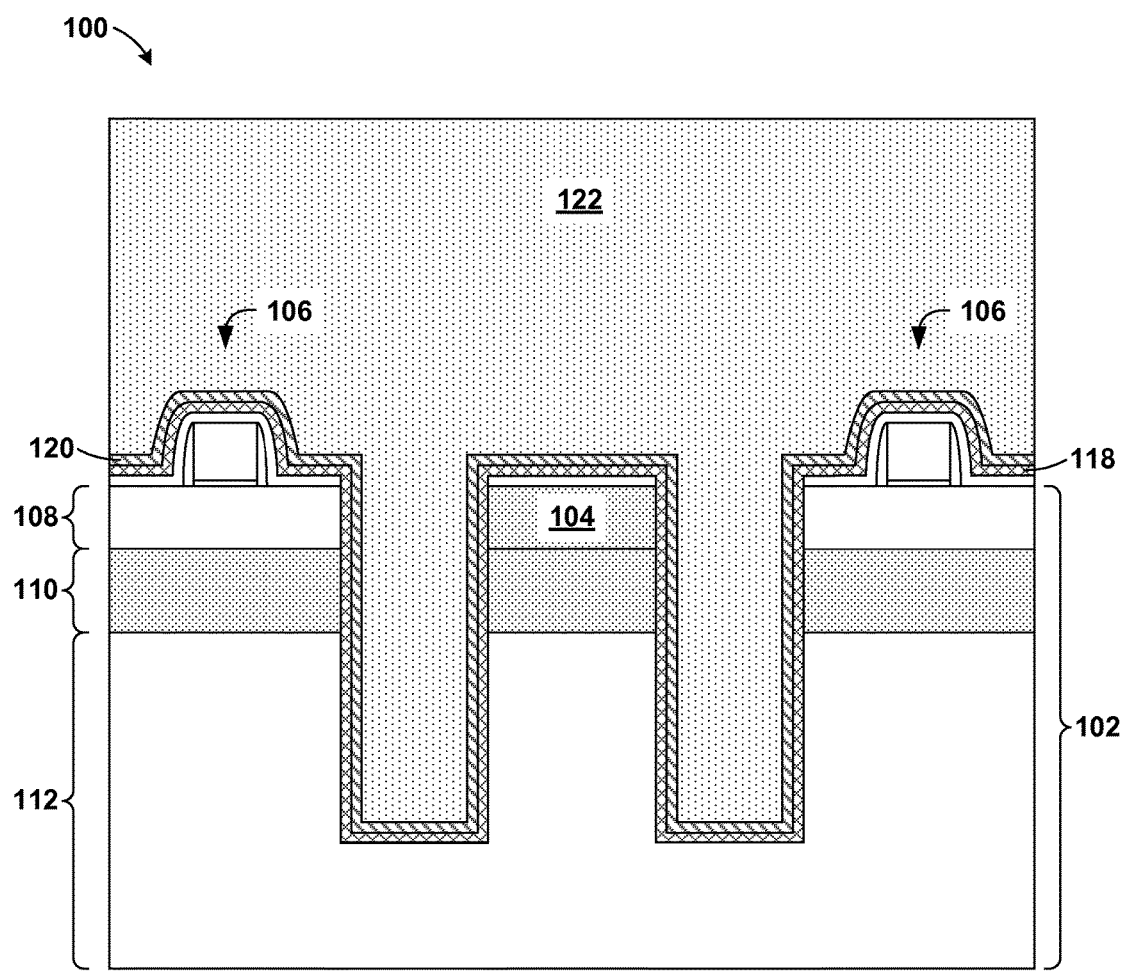
FIG. 5 illustrates forming a planarizing film in accordance with an exemplary embodiment.

Referring now to FIG. 5, after deposition of the thin metallic film 120, a planarizing film 122 is applied so such that the entire structure of FIG. 4 is covered by the planarizing film 122. The planarizing film 122 specifically plugs the deep trench 116 (FIG. 4). The planarizing film 122 is preferably formed of a photoresist or anti-reflective coating material applied by spin-on techniques to achieve planarity. Alternatively, any other material and technique can be used for forming the planarizing film 122, provided that the planarizing film 122 can be easily removed without damaging any device structure on, or in, the semiconductor substrate 102.

Figure 6:
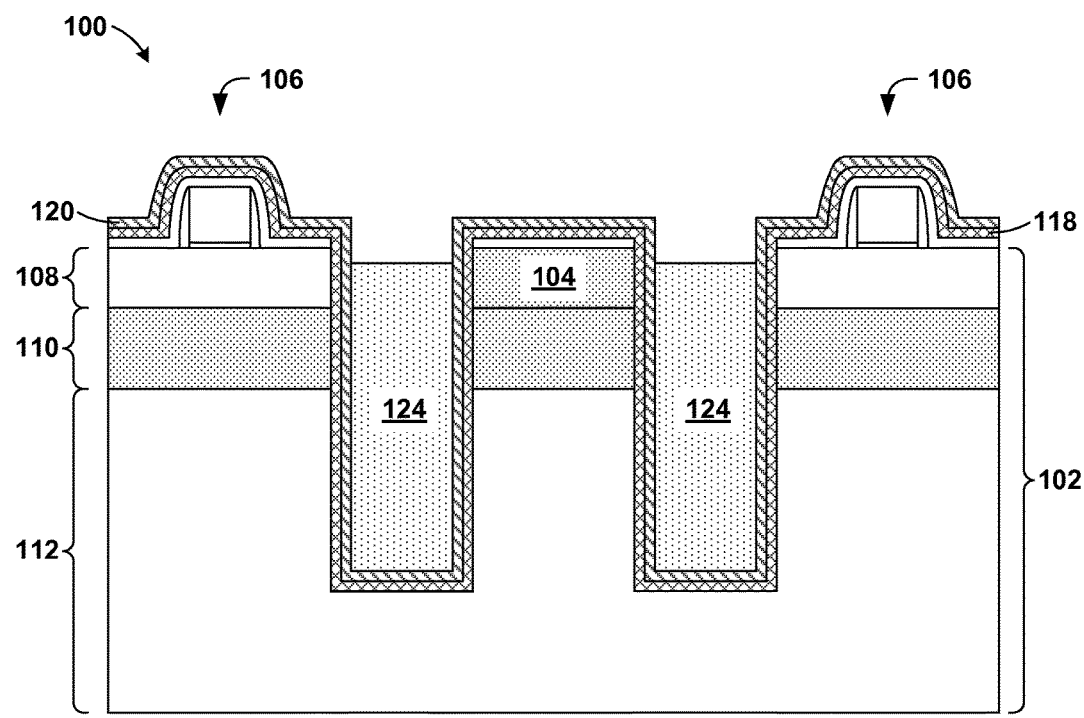
FIG. 6 illustrates recessing the planarizing film to expose portions of the oxygen gettering layer and the thin metallic film in accordance with an exemplary embodiment.

Referring now to FIG. 6, the planarizing film 122 is now etched back by using a well-controlled isotropic etching procedure such as a down-stream plasma ash. This removal procedure continues until the planarizing film 122 has been recessed slightly below the top of the deep trench 116 (FIG. 4) at a level sufficient to expose portions of the oxygen gettering layer 118 and the thin metallic film 120 above the substrate 102. A portion of the planarizing film 122 remaining in the deep trench 116 (FIG. 4) may be referred to as a first trench fill 124 as shown in FIG. 6.

Figure 7:
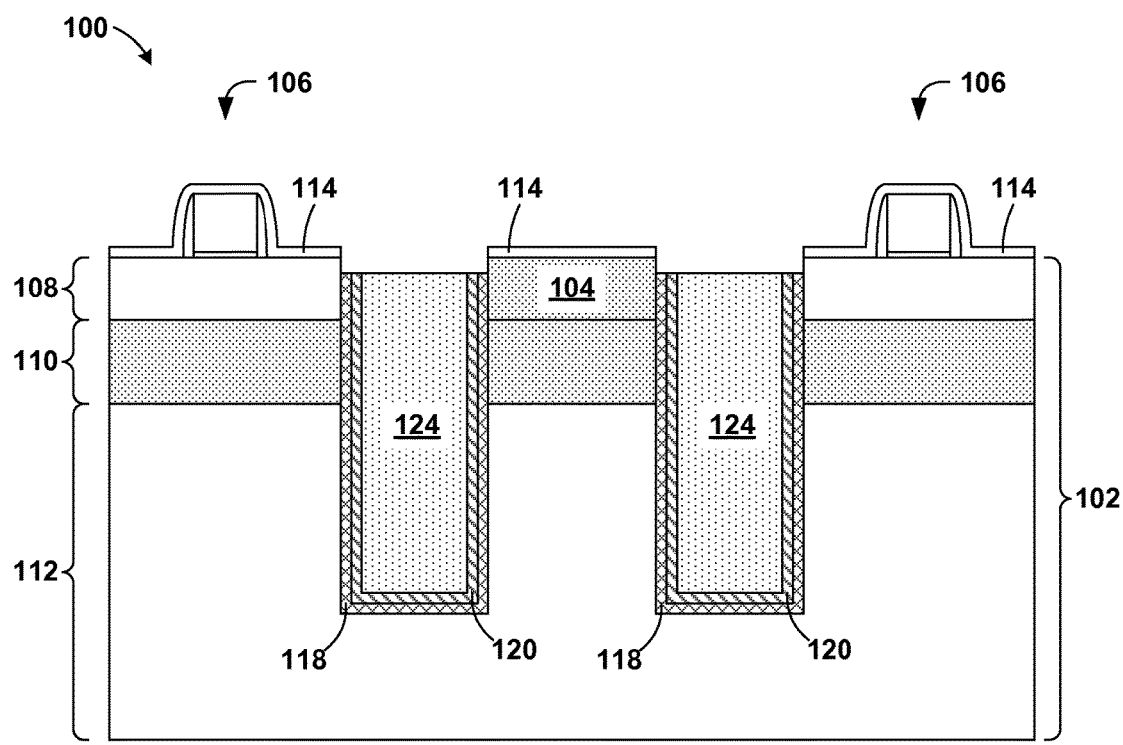
FIG. 7 illustrates removing the portions of the oxygen gettering layer and the thin metallic film in accordance with an exemplary embodiment.

Referring now to FIG. 7, another isotropic etching step is shown. For example, a downstream plasma etching or a wet chemical etching step may be used to selectively remove portions of the oxygen gettering layer 118 and the thin metallic film 120 in such a manner that they are removed from the surface of the semiconductor substrate 102, but remain within the deep trench 116 (FIG. 4)

Figure 8:
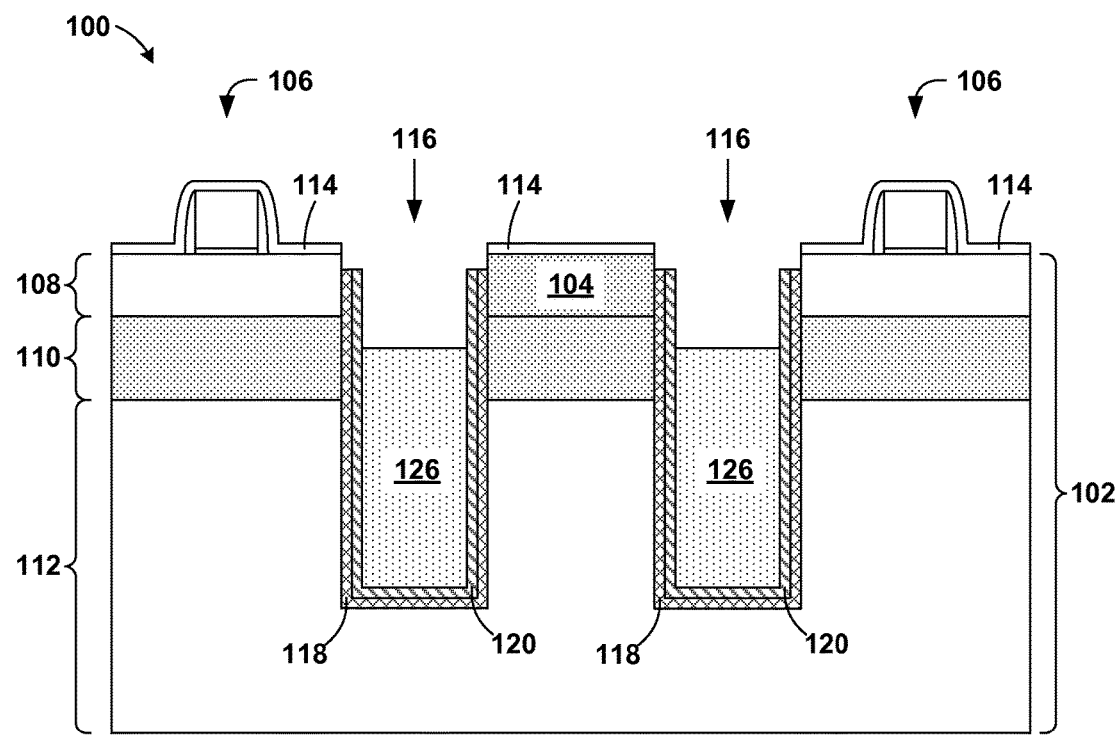
FIG. 8 illustrates further recessing the planarizing film within the deep trench in accordance with an exemplary embodiment.

Referring now to FIG. 8, the planarizing film 122 is now etched back by using another well-controlled isotropic etching procedure such as a down-stream plasma ash. This removal procedure continues until the planarizing film 122 has been recessed below the top of the deep trench 116 at a level about half way through the buried insulator layer 110, to form a second trench fill 126 as shown in the figure.

Figure 9:
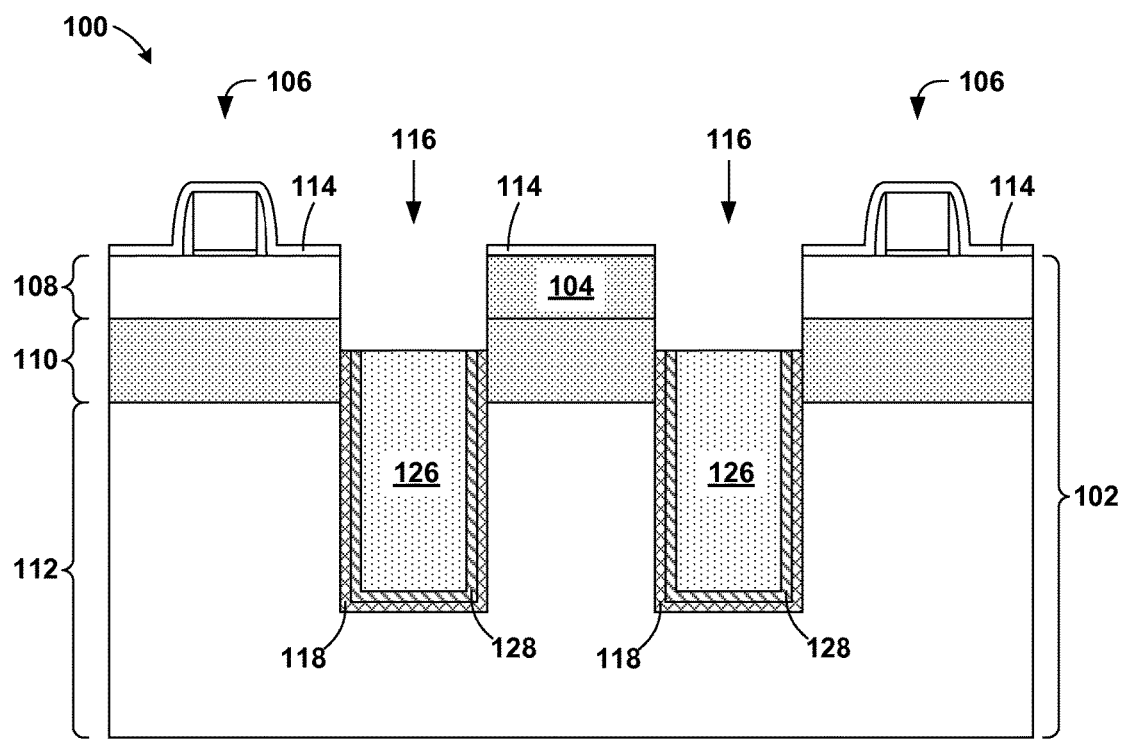
FIG. 9 illustrates further recessing the portions of the oxygen gettering layer and the thin metallic film within the deep trench in accordance with an exemplary embodiment.

Referring now to FIG. 9, another isotropic etching step is shown. For example, a downstream plasma etching or a wet chemical etching step may be used to selectively remove a portion of the oxygen gettering layer 118 and a portion of the thin metallic film 120 in such a manner that they are recessed to about the same level as the second trench fill 126. The recessed portion of the thin metallic film 120 will form an outer or buried electrode 128 for the trench capacitors of the present embodiment.

Figure 10:
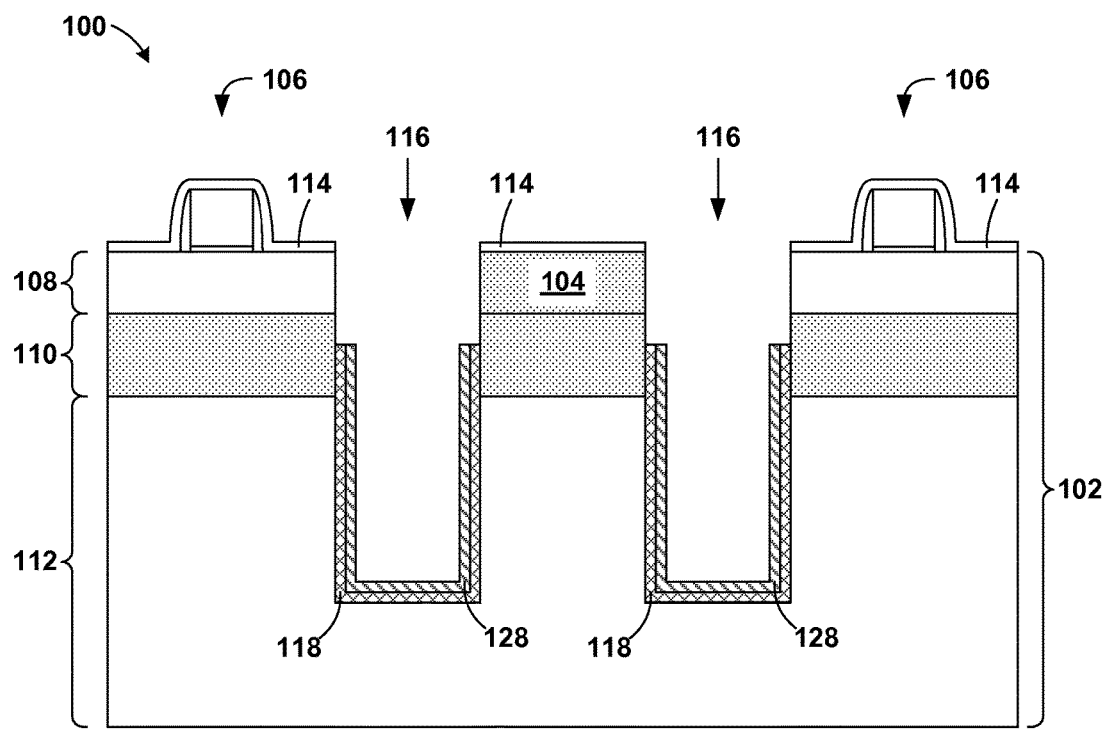
FIG. 10 illustrates removing the planarizing film from within the deep trench in accordance with an exemplary embodiment.

Referring now to FIG. 10, yet another isotropic etching step is shown. In the present etching step, the second trench fill 126 may be completely removed from the deep trench 116 to expose the outer electrode 128.

Figure 11:
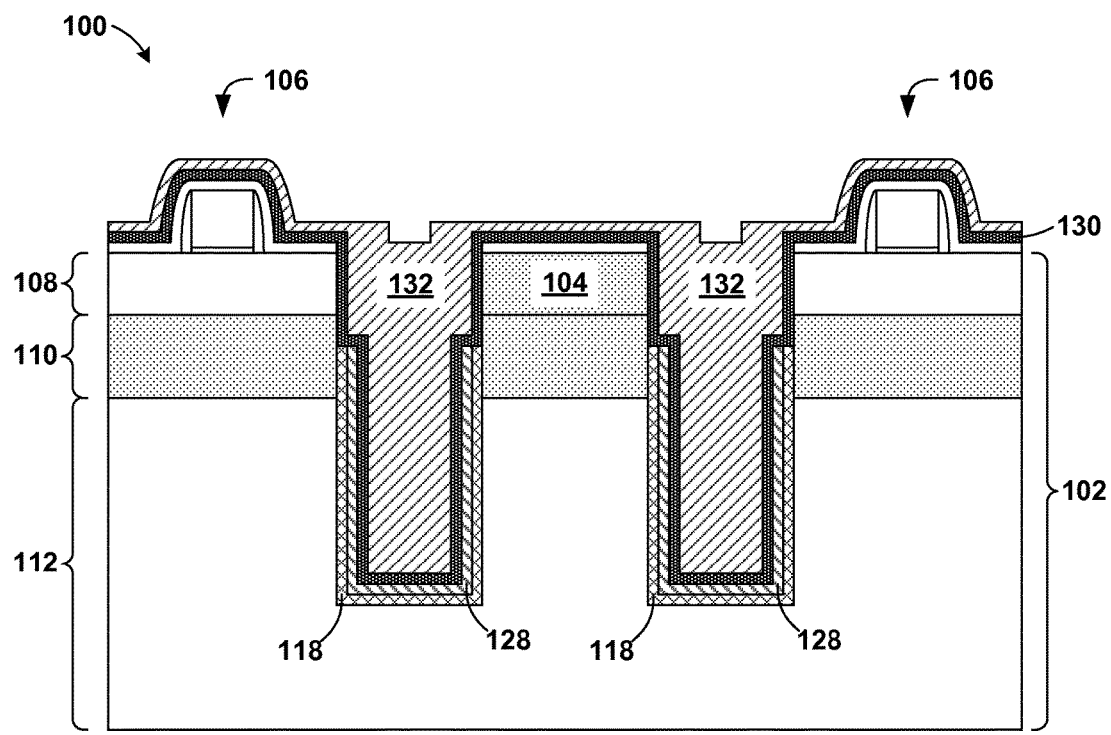
FIG. 11 illustrates forming a node dielectric layer and an inner electrode film in accordance with an exemplary embodiment.

Referring now to FIG. 11, subsequent to the etching steps described hereinabove, a node dielectric layer 130 and an inner electrode film 132 are deposited over the entire structure 100 and within the deep trench 116. The node dielectric layer 130 may include any dielectric material, including, but not limited to: hafnium oxide, barium strontium oxide, etc., and it may be deposited by any suitable dielectric deposition technique, including, but not limited to: ALD, CVD, and PVD. Preferably, the node dielectric layer 130 includes a high-k dielectric material with a dielectric constant of not less than 4.0, which allows formation of a shallower trench at a given capacitance and therefore functions to further reduce the required device processing time and complexity. The thickness of the node dielectric layer 130 preferably ranges from about 40 Å to about 500 Å. The inner electrode film 132 may include at least one metallic material, including, but not limited to: metals, metal alloys, metal nitrides, metal silicides, etc. Preferably, the inner electrode film 132 includes a metal or metal nitride, such as Ti, TiN, W, WN, Ru, etc., and it may be deposited by any suitable deposition techniques, such as ALD, CVD, electroplating or PVD. The thickness of the inner electrode film 132 preferably ranges from about 300 Å to about 1000 Å. More preferably, the top of the deep trench 116 (FIG. 8) is completely closed after deposition of the node dielectric layer 130 and the inner electrode film 132. Note that the outer electrode 128 and the inner electrode film 132 may comprise the same or different materials.

Figure 12:
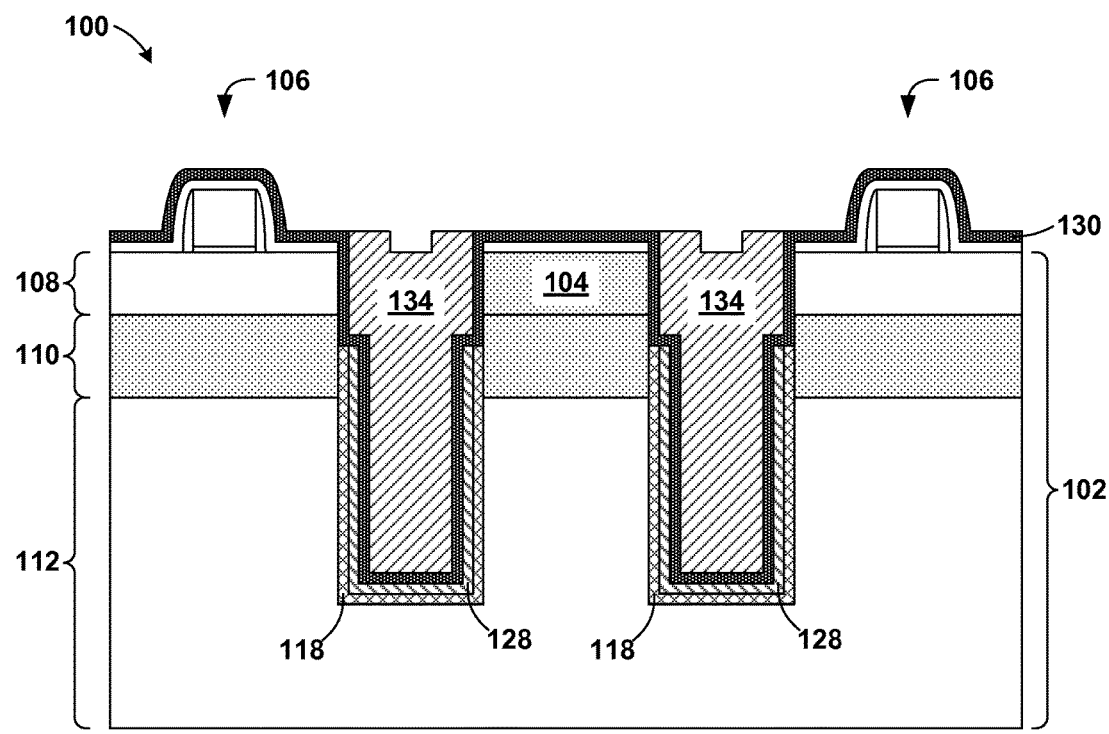
FIG. 12 illustrates removing a portion of the inner electrode film to form an inner electrode in accordance with an exemplary embodiment.

Referring now to FIG. 12, a portion of the inner electrode film 132 (FIG. 9) may be selectively removed using another isotropic etching technique to form an inner electrode 134. The portion of the inner electrode film 132 (FIG. 11) may be selectively removed without removing other materials from the structure 100. Specifically, a portion of the inner electrode film 132 (FIG. 11) on the surface of the semiconductor substrate 102 is completely removed, and a portion of the inner electrode film 132 (FIG. 11) remaining in the deep trench 116 (FIG. 10), otherwise referred to as the inner electrode 134, is preferably, but not necessarily, recessed back into the trench by a thickness substantially equivalent to the thickness of the inner electrode film 132 itself.

Figure 13:
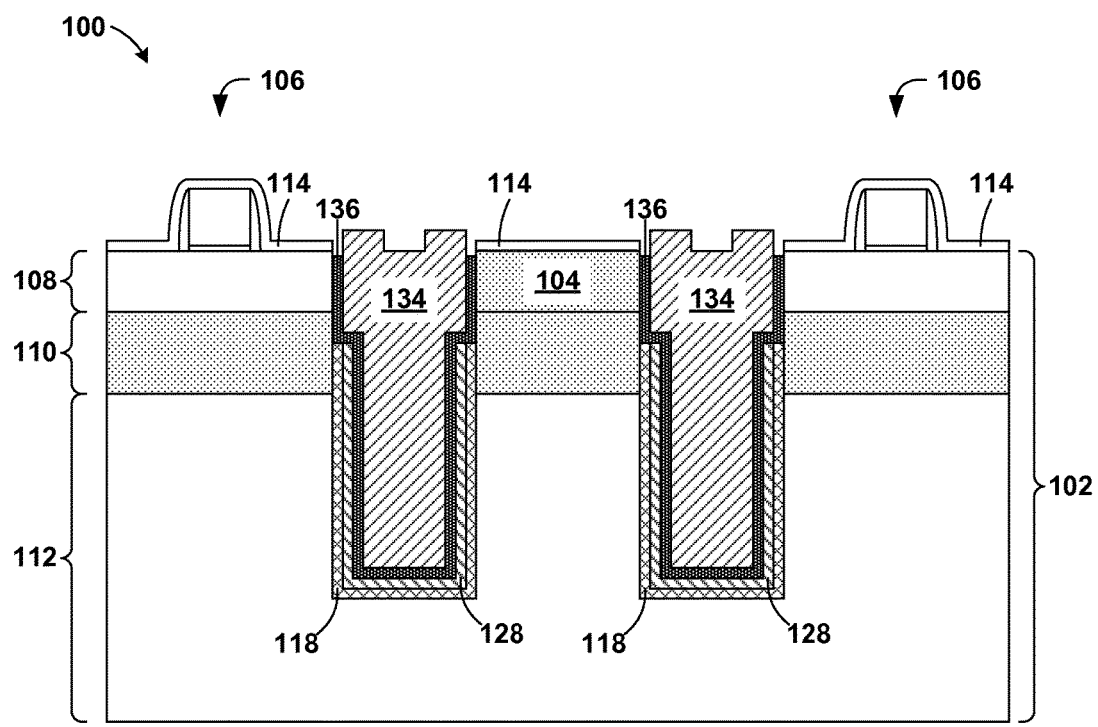
FIG. 13 illustrates removing a portion of the node dielectric layer to form a node dielectric in accordance with an exemplary embodiment.

Referring now to FIG. 13, yet another isotropic etching step is shown. In the present etching step a portion of the node dielectric layer 130 (FIG. 12) may be removed from the surface of the semiconductor substrate 102 directly above the barrier layer 114. It is important to note that the node dielectric layer 130 (FIG. 12) is recessed below the substrate surface but still above the buried insulator layer 110, thereby forming a node dielectric 136 for the trench capacitors. The node dielectric 136 may commonly be referred to as an insulating layer.

Figure 14:
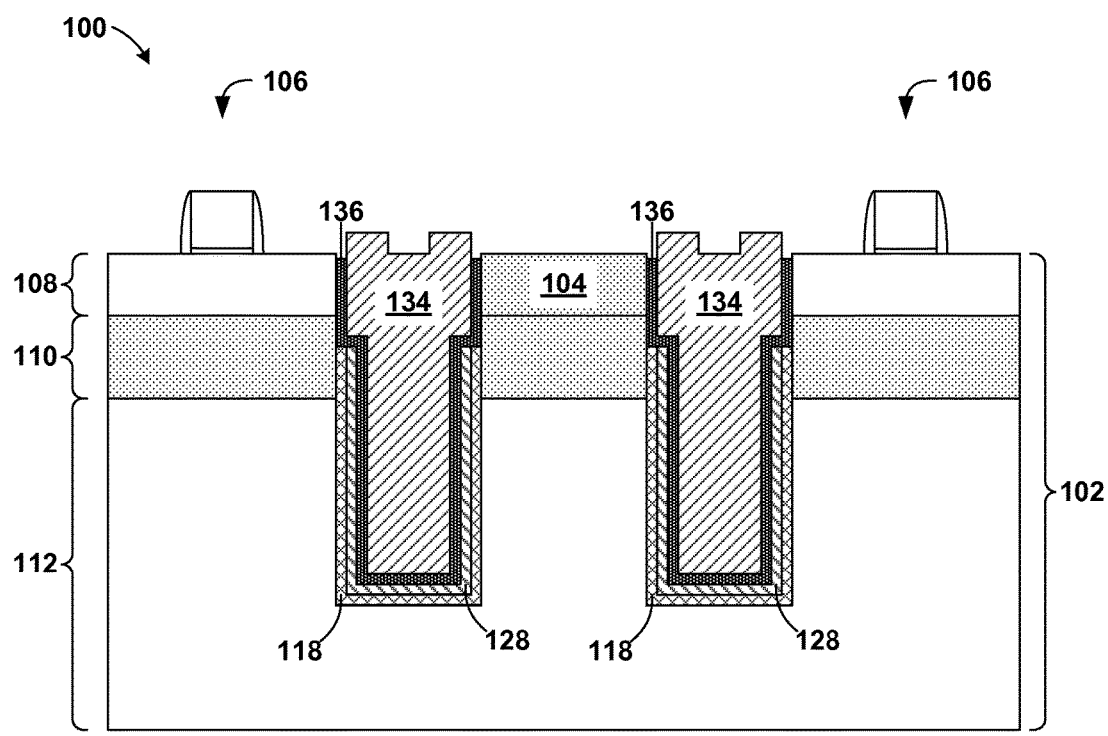
FIG. 14 illustrates removing the barrier layer in accordance with an exemplary embodiment.

Referring now to FIG. 14, a photolithographic resist (not shown) is then applied to the entire structure 100 of FIG. 12, preferably via a spin-on process. The photoresist may be used to pattern the barrier layer 114 (FIG. 13), in such a manner that the regions (such as the source and drain regions of the transistors and the regions between the transistors and the trench capacitors) where metal silicide layers are to be formed in subsequent processing steps become exposed, while the other regions (not shown) may remain covered by the patterned barrier layer 114 (FIG. 13). The barrier layer 114 (FIG. 13) is preferably patterned by an etching process, such as an RIE process or a wet etching process, and the photoresist is removed afterwards by a well-known resist-stripping process, such as a downstream plasma ash process. Note that this mask does not pertain specifically to the trench MIM capacitor process flow but to the overall wafer process flow, since it involves salicide formation for all devices on the chip, which is a standard step in semiconductor chip processing.

Figure 15:
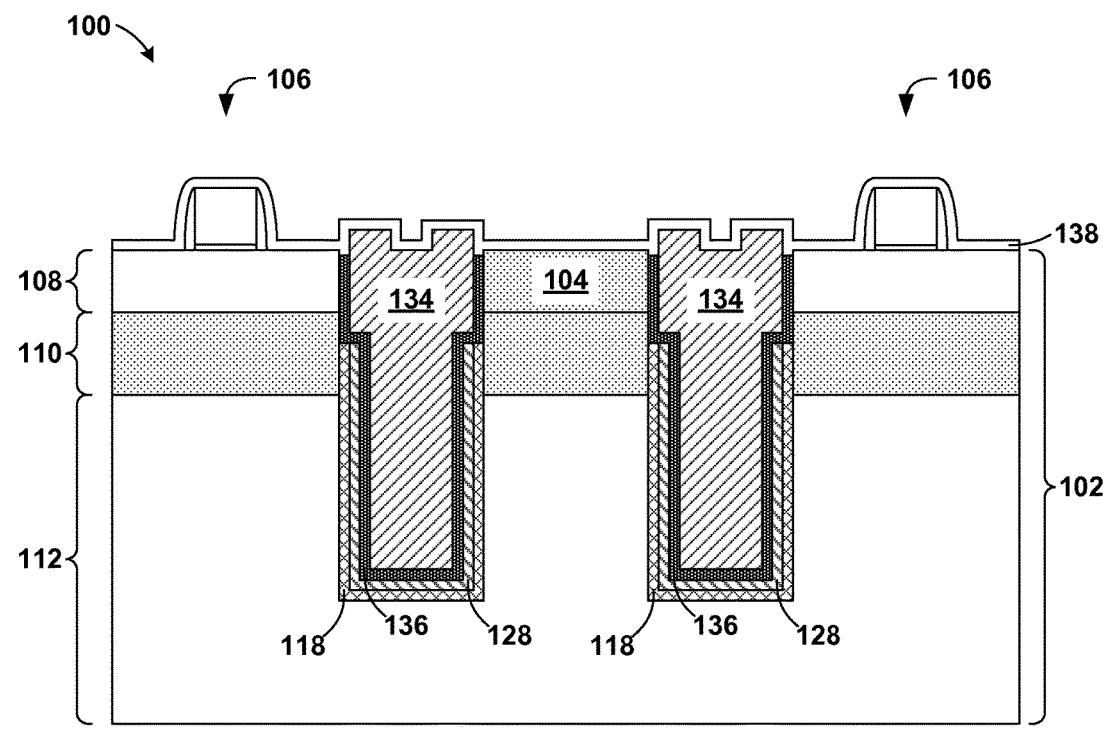
FIG. 15 illustrates forming a metal layer in accordance with an exemplary embodiment.

Referring now to FIG. 15, a silicide-forming metal layer 138 may be subsequently deposited on top of the structure 100. The metal layer 138 may include any metals or metal alloys that can react with silicon to form metal silicides. Preferably, but not necessarily, the metal layer 138 includes titanium (Ti), tantalum (Ta), tungsten (W), cobalt (Co), nickel (Ni), platinum (Pt), palladium (Pd) and alloys thereof. In an embodiment, metal layer 138 is typically from about 300 Å to about 1000 Å thick and can be deposited by methods, such as ALD, CVD or PVD. It is noted that when the semiconductor substrate 102 does not include silicon, a silicon layer (not shown) can be formed atop the non-silicon-containing substrate prior to deposition of the metal layer 138.

Figure 16:
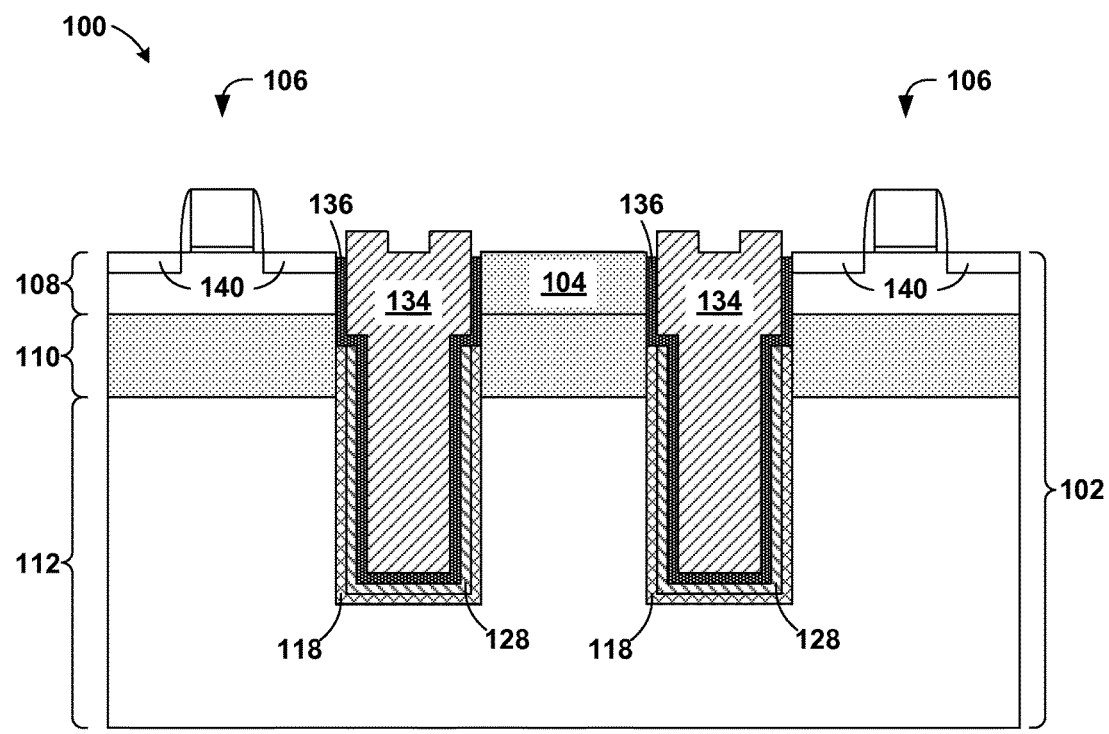
FIG. 16 illustrates annealing and formation of silicides in accordance with an exemplary embodiment.

The entire structure of FIG. 15 is then annealed at a predetermined elevated temperature at which the metal layer 138 reacts with silicon on the silicon-containing semiconductor substrate 102 or the silicon layer deposited over a non-silicon-containing substrate, to form metal silicides 140 of relatively low contact resistance, as shown in FIG. 16. The annealing is typically performed in an inert gas atmosphere, for example, He, Ar, $N_2$, or forming gas at relatively low temperatures ranging from about 100° C. to about 600° C., preferably from about 300° C. to about 500° C., and most preferably from about 300° C. to about 450° C., by using a continuous heating regime or various ramp and soak heating cycles. Unreacted metal is removed from the substrate surface after formation of the metal silicides 140.

For certain metals such as cobalt (Co) or titanium (Ti), a second annealing step may be employed to form metal silicides such as $CoSi_2$ or $TiSi_2$. Specifically, after deposition of the metal layer 138, a first annealing step is employed to form a metal silicide of a first silicide phase (e.g., CoSi or TiSi) of higher resistivity. Next, the unreacted metal is removed from the structure 100, followed by a second annealing step carried out at a different annealing temperature to convert the metal silicide from the first silicide phase to a second silicide phase (e.g., $CoSi_2$ or $TiSi_2$) of lower resistivity.

The structure 100 shown in FIG. 16 therefore contains transistors with source/drain metal silicide contacts 140 as well as metal-insulator-metal (MIM) trench capacitors (including elements 118, 128, 136, and 134) that are connected to the transistors by the metal silicides 140, which function as the connective link or strap.

Figure 17:
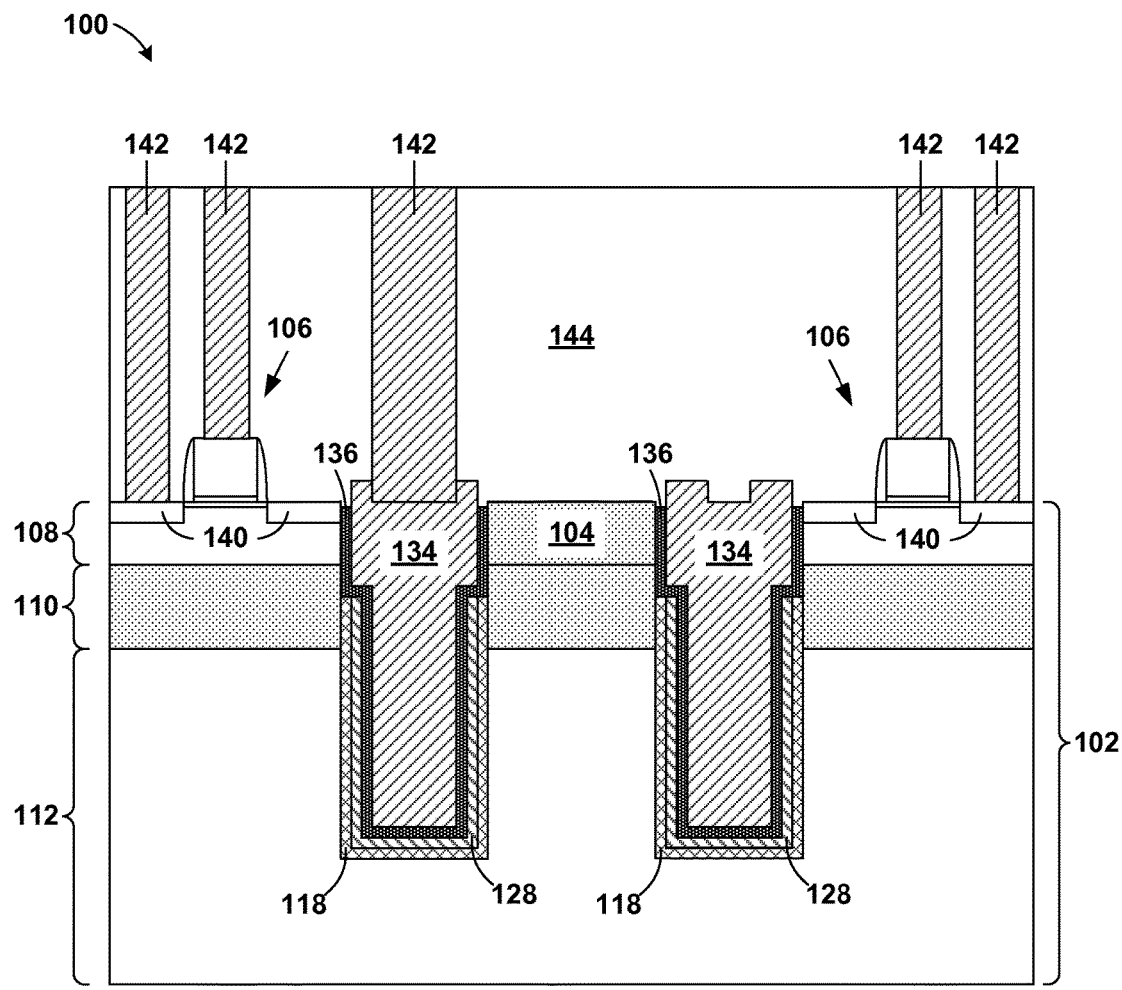
FIG. 17 illustrates a final structure after forming a middle-of-line dielectric layer and contacts in accordance with an exemplary embodiment.

Referring now to FIG. 17, processing of the trench capacitors is complete, and contacts 142 to the structure 100 can be fabricated by conventional back-end-of-line (BEOL) processes. For example, an interlayer dielectric (ILD) 144 or middle-of-line (MOL) dielectric can be deposited over the entire structure 100, which is then patterned to form the contacts 142 to the transistors 106 and the trench capacitors of the structure 100. Some of the contacts 142 may directly land on the trench capacitors, depending on the nature of the application.

The processing steps described hereinabove therefore form trench capacitors that have metallic electrodes and can be readily integrated into the salicidation module of a CMOS process flow. By introducing metal species to the semiconductor wafer after formation of the transistors and before the salicidation steps, the problem associated with metal contamination and migration is solved, which allows incorporation of MIM trench capacitors side-by-side with FETs into the eDRAM or DRAM devices. Further, the trench capacitors of the present embodiments are connected to the FET source/drain regions by metal silicide straps, which have much lower resistances than the conventional out-diffused straps and further reduce the parasitic series resistance in the structure 100. Moreover, by obviating use of the poly-Si electrodes, the cost and process time of the trench capacitors is significantly reduced.

In general, as previously stated hereinabove the arrangement of the outer electrode 128, the node dielectric 136, and the inner electrode 132 form a typical MIM trench capacitor. The oxygen gettering layer 118 is integrated into fabrication of the MIM trench capacitor specifically to address or curtail the formation of unwanted interfacial oxides forming during processing. Traditional MIM trench capacitors have the potential to improve circuit speeds at reduced dimensions enabling future technologies at 10 nm process nodes and beyond. A stable and clean interface between the outer electrode (128) and the insulating layer, i.e. node dielectric 136, is critical to achieve high performance because some oxide formation at that interface may degrade performance and speed. In some cases, capacitance dispersion may be observed at different frequencies when the unwanted interfacial oxide is present. One method by which to limit or prevent the formation of the interfacial oxide includes adding one or more oxygen gettering layers, such as, for example, the oxygen gettering layer 118, as described above. More specifically, the oxygen gettering layer 118 may be strategically included in the structure 100 to attract vagrant oxygen atoms during and after the deposition and formation of the node dielectric 136. The node dielectric 136 or it formation thereof may be one source of vagrant oxygen atoms which would otherwise diffuse throughout the structure 100 ultimately contacting the substrate and forming the unwanted interfacial oxide as described above.

It should be noted that the oxygen gettering layer 118 may be integrated in to the fabrication of the MIM trench capacitor in any number of configurations in order to specifically attack interfacial oxidation. Non-limiting examples of various configurations are described below with reference to FIGS. 18-21.

Figure 18:
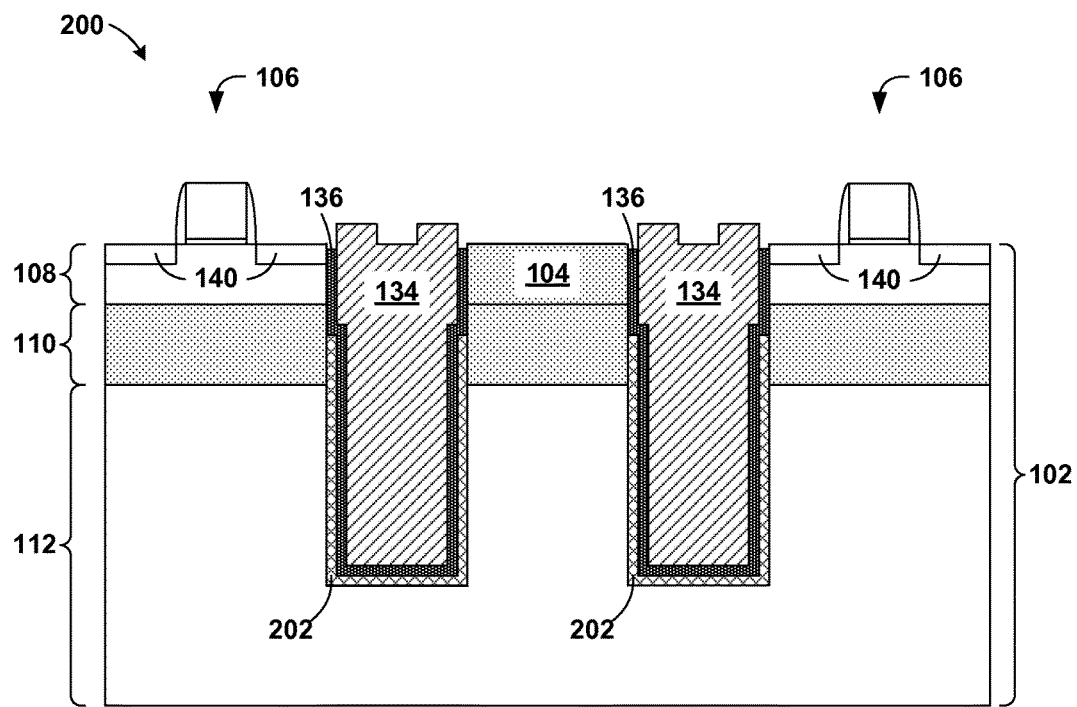
FIG. 18 illustrates an alternative embodiment in accordance with an exemplary embodiment.

Referring now to FIG. 18, a structure 200 is shown according to an alternative embodiment. The structure 200 is substantially similar in all respects to the structure 100 of FIG. 16, except as noted below. In the present embodiment, the structure 200 includes a single metallic liner 202 directly beneath the node dielectric 136. The single metallic liner 202 may serve two functions: that of (a) the outer electrode (128) and that of (b) the oxygen gettering layer (118), both of FIG. 7. The single metallic liner 202 of the present embodiment may be substantially similar in composition to the oxygen gettering layer 118 describe above.

In an embodiment, the single metallic liner 202 may include an element or compound of elements which will scavenge or getter oxygen during capacitor processing and substantially reduce or eliminate the formation of unwanted interfacial oxides. In an embodiment, the single metallic liner 202 may include a pentavalent ion which may attract the oxygen in order to reduce or eliminate the formation of unwanted interfacial oxides. In a particular embodiment, the single metallic liner 202 includes an aluminum containing compound, the aluminum being the element specifically chosen to getter vagrant oxygen during processing and fabrication. In an embodiment, aluminum containing compounds to be used as the single metallic liner 202 may include titanium aluminum nitride, titanium aluminum carbide, tantalum aluminum nitride, tantalum aluminum carbide, tungsten aluminum nitride, tungsten aluminum carbide, cobalt aluminum nitride, or cobalt aluminum carbide. The preferred thickness of the single metallic liner 202 ranges from about 10 Å to about 50 Å. The single metallic liner 202 may be formed by known deposition techniques, such as, for example, chemical vapor deposition (CVD), plasma enhanced chemical vapor deposition (PECVD), physical vapor deposition (PVD), or atomic layer deposition (ALD), plating, thermal or ebeam evaporation and sputtering.

In the present example, the single metallic liner 202 is deposited directly on top of the substrate enabling it to effectively control oxidation of the substrate by gettering oxygen during capacitor processing. As such, the single metallic liner 202 of the present embodiment may preferably be in direct contact with the semiconductor substrate 102, or more specifically, direct contact with the base layer 112 of the semiconductor substrate 102.

Figure 19:
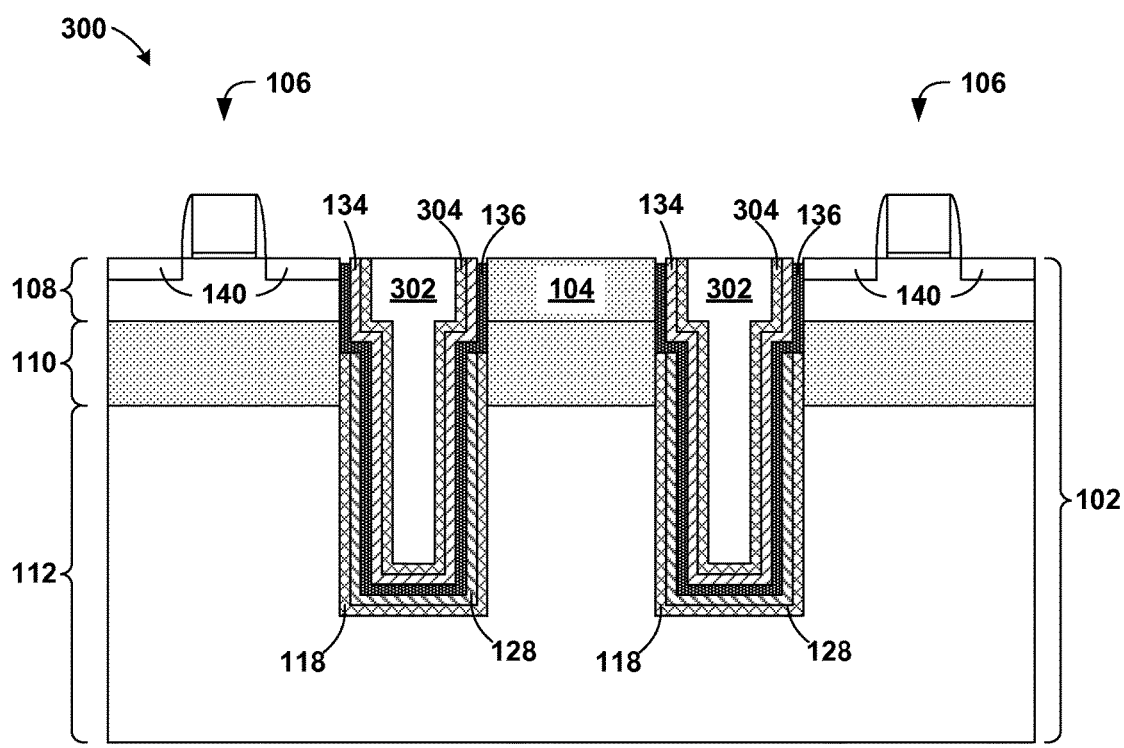
FIG. 19 illustrates an alternative embodiment in accordance with an exemplary embodiment.

Referring now to FIG. 19, a structure 300 is shown according to an alternative embodiment. The structure 300 is substantially similar in all respects to the structure 100 of FIG. 16, except as noted below. In the present embodiment, the inner electrode 134 may be a thin metallic film similar to that used to form the outer electrode 128 above with reference to FIGS. 4-7. In the present embodiment, the deep trench may be substantially filled with a polysilicon fill material 302 rather than the inner electrode 134 as in other embodiments. Furthermore, the structure 300 of the present embodiment includes two oxygen gettering layers, one on each side, or opposite sides, of the node dielectric 136. More specifically, another oxygen gettering layer 304 may be included directly on top of the inner electrode 134 in addition to the oxygen gettering layer 118 beneath the node dielectric 136. The other oxygen gettering layer 304 may be substantially similar in all respects to the oxygen gettering layer 118, except as noted below.

In an embodiment, the other oxygen gettering layer 304 may include an element or compound of elements which will scavenge or getter oxygen during capacitor processing and substantially reduce or eliminate the formation of unwanted interfacial oxides. In an embodiment, the other oxygen gettering layer 304 may include a pentavalent ion which may attract the oxygen in order to reduce or eliminate the formation of unwanted interfacial oxides. In a particular embodiment, the other oxygen gettering layer 304 includes an aluminum containing compound, the aluminum being the element specifically chosen to getter vagrant oxygen during processing and fabrication. In an embodiment, aluminum containing compounds to be used as the other oxygen gettering layer 304 may include titanium aluminum nitride, titanium aluminum carbide, tantalum aluminum nitride, tantalum aluminum carbide, tungsten aluminum nitride, tungsten aluminum carbide, cobalt aluminum nitride, or cobalt aluminum carbide. The preferred thickness of the other oxygen gettering layer 304 ranges from about 10 Å to about 50 Å. The other oxygen gettering layer 304 may be formed by known deposition techniques, such as, for example, chemical vapor deposition (CVD), plasma enhanced chemical vapor deposition (PECVD), physical vapor deposition (PVD), or atomic layer deposition (ALD), plating, thermal or ebeam evaporation and sputtering.

In the present example, the other oxygen gettering layer 304 is deposited directly on top of the inner electrode 134 immediately prior to filling the deep trench with the polysilicon fill material 302 enabling it to effectively control oxidation of the polysilicon fill material 302 by gettering oxygen during capacitor processing.

Figure 20:
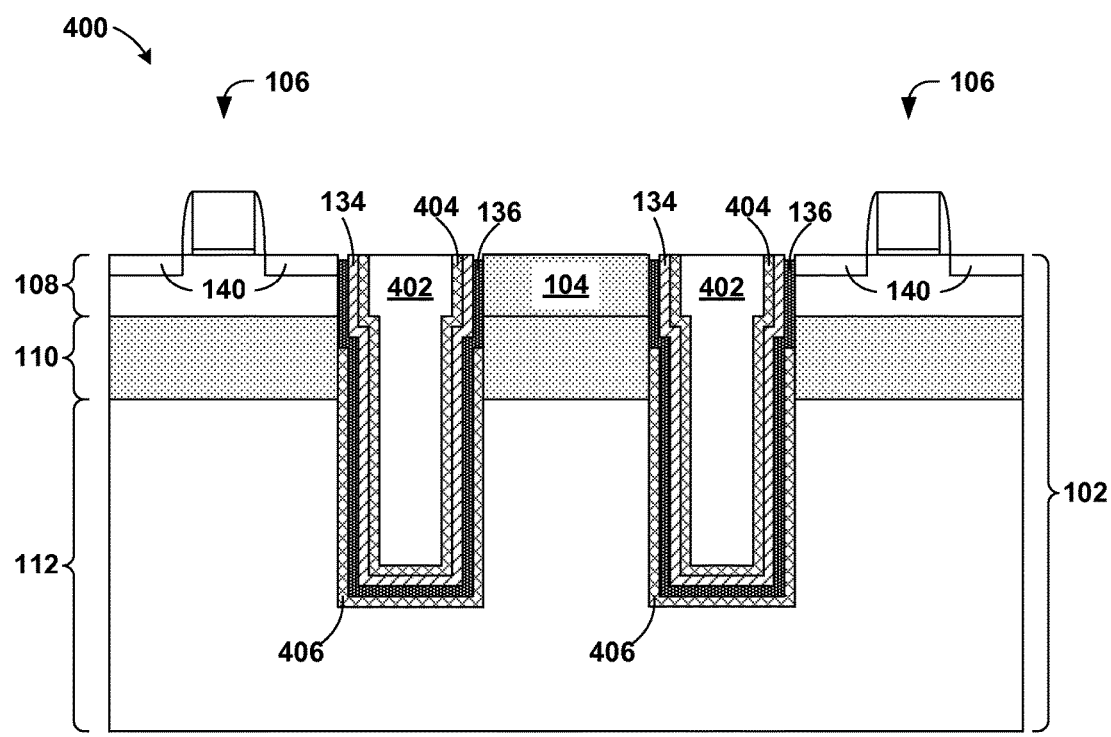
FIG. 20 illustrates an alternative embodiment in accordance with an exemplary embodiment.

Referring now to FIG. 20, a structure 400 is shown according to an alternative embodiment. The structure 400 is substantially similar in all respects to the structure 100 of FIG. 16, except as noted below. In the present embodiment, the inner electrode 134 may be a thin metallic film similar to that used to form the outer electrode 128 above with reference to FIGS. 4-7. In the present embodiment, the deep trench may be substantially filled with a polysilicon fill material 402 rather than the inner electrode 134 as in other embodiments. Furthermore, the structure 400 of the present embodiment includes two oxygen gettering layers, one on each side, or opposite sides, of the node dielectric 136. More specifically, another oxygen gettering layer 404 may be included directly on top of the inner electrode 134 in addition to the oxygen gettering layer 118 beneath the node dielectic 136. The other oxygen gettering layer 404 may be substantially similar in all respects to the oxygen gettering layer 118, except as noted below.

In an embodiment, the other oxygen gettering layer 404 may include an element or compound of elements which will scavenge or getter oxygen during capacitor processing and substantially reduce or eliminate the formation of unwanted interfacial oxides. In an embodiment, the other oxygen gettering layer 404 may include a pentavalent ion which may attract the oxygen in order to reduce or eliminate the formation of unwanted interfacial oxides. In a particular embodiment, the other oxygen gettering layer 404 includes an aluminum containing compound, the aluminum being the element specifically chosen to getter vagrant oxygen during processing and fabrication. In an embodiment, aluminum containing compounds to be used as the other oxygen gettering layer 404 may include titanium aluminum nitride, titanium aluminum carbide, tantalum aluminum nitride, tantalum aluminum carbide, tungsten aluminum nitride, tungsten aluminum carbide, cobalt aluminum nitride, or cobalt aluminum carbide. The preferred thickness of the other oxygen gettering layer 404 ranges from about 10 Å to about 50 Å. The other oxygen gettering layer 404 may be formed by known deposition techniques, such as, for example, chemical vapor deposition (CVD), plasma enhanced chemical vapor deposition (PECVD), physical vapor deposition (PVD), or atomic layer deposition (ALD), plating, thermal or ebeam evaporation and sputtering.

In the present example, the other oxygen gettering layer 404 is deposited directly on top of the inner electrode 134 immediately prior to filling the deep trench with the polysilicon fill material 402 enabling it to effectively control oxidation of the polysilicon fill material 402 by gettering oxygen during capacitor processing.

The structure 400 also includes a single metallic liner 406 beneath the node dielectric 136. The single metallic liner 406 may serve two functions: that of (a) the outer electrode (128) and that of (b) the oxygen gettering layer (118), both of FIG. 7. The single metallic liner 406 of the present embodiment may be substantially similar in composition to the oxygen gettering layer 118 describe above.

In an embodiment, the single metallic liner 406 may include an element or compound of elements which will scavenge or getter oxygen during capacitor processing and substantially reduce or eliminate the formation of unwanted interfacial oxides. In an embodiment, the single metallic liner 406 may include a pentavalent ion which may attract the oxygen in order to reduce or eliminate the formation of unwanted interfacial oxides. In a particular embodiment, the single metallic liner 406 includes an aluminum containing compound, the aluminum being the element specifically chosen to getter vagrant oxygen during processing and fabrication. In an embodiment, aluminum containing compounds to be used as the single metallic liner 406 may include titanium aluminum nitride, titanium aluminum carbide, tantalum aluminum nitride, tantalum aluminum carbide, tungsten aluminum nitride, tungsten aluminum carbide, cobalt aluminum nitride, or cobalt aluminum carbide. The preferred thickness of the single metallic liner 406 ranges from about 10 Å to about 50 Å. The single metallic liner 406 may be formed by known deposition techniques, such as, for example, chemical vapor deposition (CVD), plasma enhanced chemical vapor deposition (PECVD), physical vapor deposition (PVD), or atomic layer deposition (ALD), plating, thermal or ebeam evaporation and sputtering.

In the present example, the single metallic liner 406 is deposited directly on top of the substrate enabling it to effectively control oxidation of the substrate by gettering oxygen during capacitor processing. As such, the single metallic liner 406 of the present embodiment may preferably be in direct contact with the semiconductor substrate 102, or more specifically, direct contact with the base layer 112 of the semiconductor substrate 102.

Figure 21:
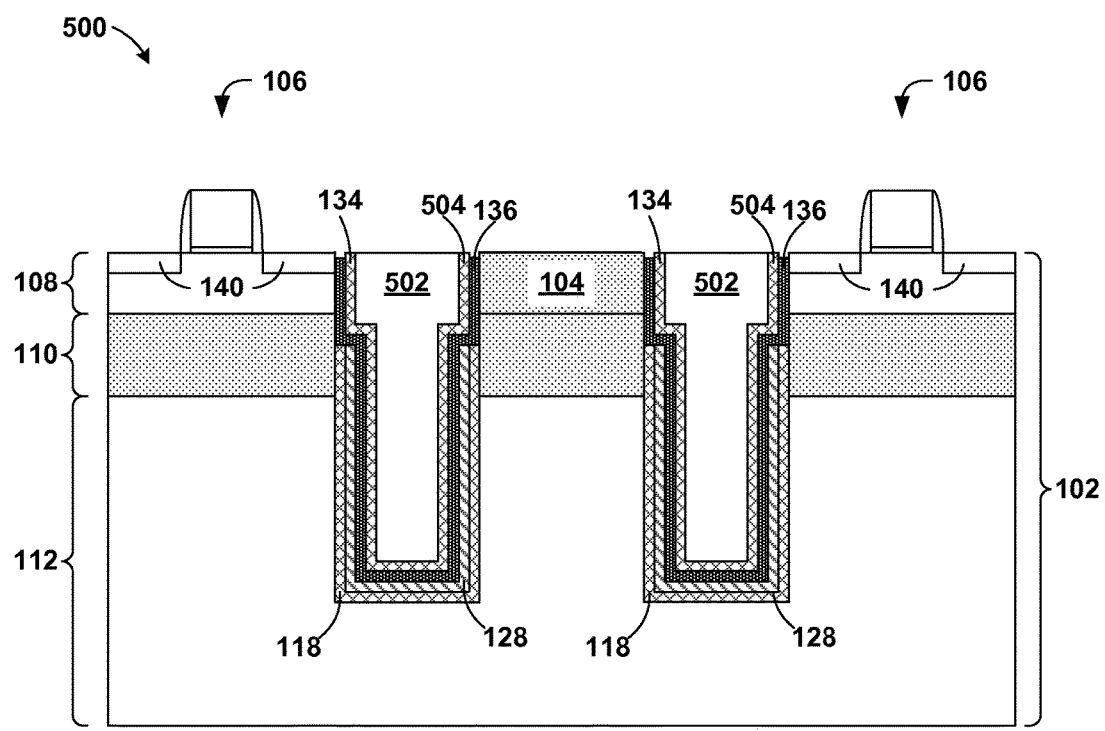
FIG. 21 illustrates an alternative embodiment in accordance with an exemplary embodiment.

Referring now to FIG. 21, a structure 500 is shown according to an alternative embodiment. The structure 500 is substantially similar in all respects to the structure 100 of FIG. 16, except as noted below. In the present embodiment, the inner electrode 134 may be a thin metallic film similar to that used to form the outer electrode 128 above with reference to FIGS. 4-7. In the present embodiment, the deep trench may be substantially filled with a polysilicon fill material 502 rather than the inner electrode 134 as in other embodiments. Furthermore, the structure 500 of the present embodiment includes two oxygen gettering layers, one on each side, or opposite sides, of the node dielectric 136.

In the present embodiment, the structure 500 includes a single metallic liner 504 directly above the node dielectric 136. The single metallic liner 504 may serve two functions: that of (a) the outer electrode (128) and that of (b) the oxygen gettering layer (304), both of FIG. 19. The single metallic liner 504 of the present embodiment may be substantially similar in composition to the oxygen gettering layer 118 describe above.

In an embodiment, the single metallic liner 504 may include an element or compound of elements which will scavenge or getter oxygen during capacitor processing and substantially reduce or eliminate the formation of unwanted interfacial oxides. In an embodiment, the single metallic liner 504 may include a pentavalent ion which may attract the oxygen in order to reduce or eliminate the formation of unwanted interfacial oxides. In a particular embodiment, the single metallic liner 504 includes an aluminum containing compound, the aluminum being the element specifically chosen to getter vagrant oxygen during processing and fabrication. In an embodiment, aluminum containing compounds to be used as the single metallic liner 504 may include titanium aluminum nitride, titanium aluminum carbide, tantalum aluminum nitride, tantalum aluminum carbide, tungsten aluminum nitride, tungsten aluminum carbide, cobalt aluminum nitride, or cobalt aluminum carbide.

The preferred thickness of the single metallic liner 504 ranges from about 10 Å to about 50 Å. The single metallic liner 504 may be formed by known deposition techniques, such as, for example, chemical vapor deposition (CVD), plasma enhanced chemical vapor deposition (PECVD), physical vapor deposition (PVD), or atomic layer deposition (ALD), plating, thermal or ebeam evaporation and sputtering.

In the present example, the single metallic liner 504 is deposited directly on top of the node dielectric 136 immediately prior to filling the deep trench with the polysilicon fill material 502 enabling it to effectively control oxidation of the polysilicon fill material 502 by gettering oxygen during capacitor processing.

Figure 22:
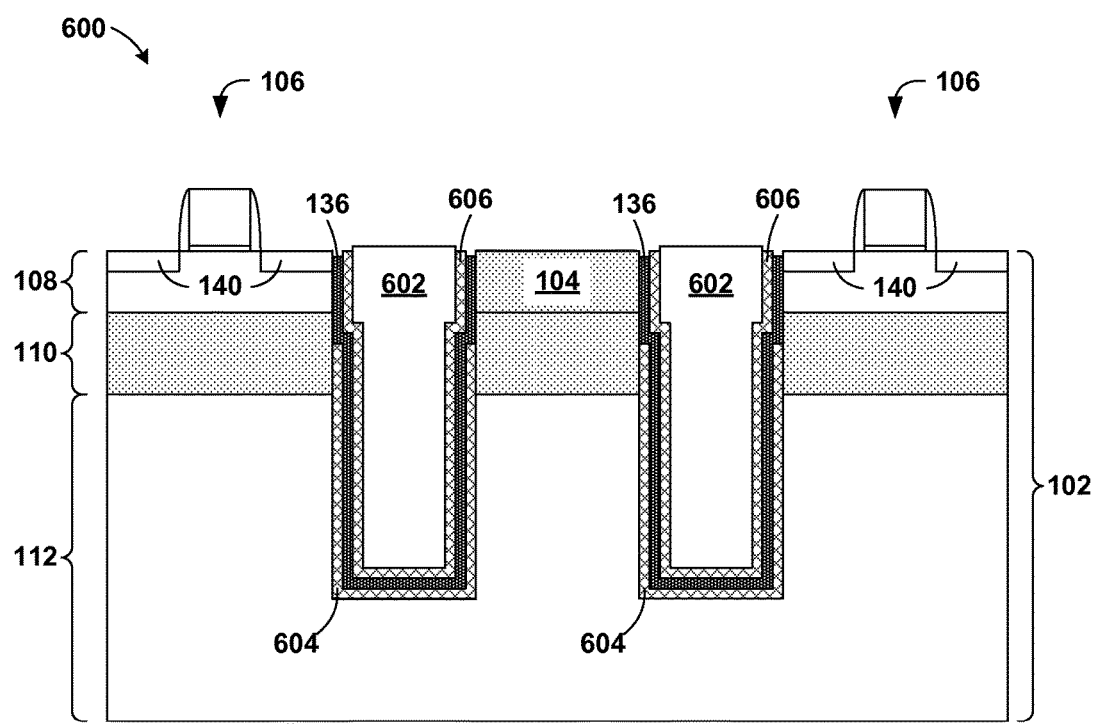
FIG. 22 illustrates an alternative embodiment in accordance with an exemplary embodiment.

Referring now to FIG. 22, a structure 600 is shown according to an alternative embodiment. The structure 600 is substantially similar in all respects to the structure 100 of FIG. 16, except as noted below. In the present embodiment, the inner electrode 134 may be a thin metallic film similar to that used to form the outer electrode 128 above with reference to FIGS. 4-7. In the present embodiment, the deep trench may be substantially filled with a polysilicon fill material 602 rather than the inner electrode 134 as in other embodiments. Furthermore, the structure 600 of the present embodiment includes two oxygen gettering layers, one on each side, or opposite sides, of the node dielectric 136.

In the present embodiment, the structure 600 includes a first metallic liner 604 directly beneath the node dielectric 136 and a second first metallic liner 606 directly above the node dielectric 136. The first metallic liner 604 may serve two functions: that of (a) the outer electrode (128) and that of (b) the oxygen gettering layer (118), both of FIG. 7. Similarly, the second metallic liner 606 may serve two functions: that of (a) the inner electrode (134) and that of (b) the oxygen gettering layer (304), both of FIG. 19. Both of the first and second metallic liners 604, 606 of the present embodiment may be substantially similar in composition to the oxygen gettering layer 118 describe above.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
   forming a deep trench capacitor in a semiconductor substrate, the deep trench capacitor comprising a first oxygen gettering layer on a first side of a node dielectric, the first oxygen gettering layer comprising an aluminum containing compound;
   causing the first oxygen gettering layer to be in direct contact with the semiconductor substrate; and
   forming an outer electrode between and in direct contact with the first oxygen gettering layer and the node dielectric, the outer electrode of the deer trench capacitor being positioned below the node dielectric.

2. The method of claim 1, wherein the aluminum containing compound of the first oxygen gettering layer comprises titanium aluminum nitride, titanium aluminum carbide, tantalum aluminum nitride, tantalum aluminum carbide, tungsten aluminum nitride, tungsten aluminum carbide, cobalt aluminum nitride, or cobalt aluminum carbide.

3. The method of claim 1, further comprising:
   forming a second oxygen gettering layer on a second side of the node dielectric, the second oxygen gettering layer also comprising an aluminum containing compound; and
   forming an inner electrode between and in direct contact with the second oxygen gettering layer and the node dielectric, the inner electrode of the deep trench capacitor being positioned above the node dielectric.

4. A method comprising:
   forming a deep trench capacitor in a semiconductor substrate, the deep trench capacitor comprising a first oxygen gettering layer on a first side of a node dielectric, the first oxygen gettering layer comprising an aluminum containing compound;
   causing the first oxygen gettering layer to be in direct contact with a polysilicon fill material; and
   forming an inner electrode between and in direct contact with the first oxygen gettering layer and the node dielectric, the inner electrode of the deep trench capacitor being positioned above the node dielectric.

5. A structure comprising:
   a first oxygen gettering layer on one side of an insulating layer of a deep trench capacitor between the insulating layer and a substrate, the first oxygen gettering layer comprising an aluminum containing compound;
   an inner electrode on top of the insulating layer, the inner electrode comprising a metal; and
   an outer electrode between and in direct contact with the first oxygen gettering layer and the insulating layer, the outer electrode comprising a metal.

6. The structure of claim 5, wherein the aluminum containing compound of the oxygen gettering layer comprises titanium aluminum nitride, titanium aluminum carbide, tantalum aluminum nitride, tantalum aluminum carbide, tungsten aluminum nitride, tungsten aluminum carbide, cobalt aluminum nitride, or cobalt aluminum carbide.

7. The structure of claim 5, further comprising;
   a second oxygen gettering layer on an opposite side of the insulating layer.

8. The structure of claim 5, further comprising:
   a second oxygen gettering layer on an opposite side of the insulating layer; and
   a second inner electrode between and in direct contact with the second oxygen gettering layer and the insulating layer, said second inner electrode comprising a metal.

* * * * *